United States Patent [19]
Richardson et al.

[11] Patent Number: 6,097,001
[45] Date of Patent: Aug. 1, 2000

[54] PORTABLE HEATING TENT AND METHOD FOR TESTING TELECOMMUNICATIONS EQUIPMENT

[75] Inventors: John Albert Richardson, Garland; Darrell Ray Grintz, Leonard; Steve Ray Bishop, Princeton; Arthur Child Walker, Garland, all of Tex.

[73] Assignee: Alcatel

[21] Appl. No.: 08/885,247

[22] Filed: Jun. 30, 1997

[51] Int. Cl.[7] ............................. G01N 25/00; F27B 5/16; F27D 7/04
[52] U.S. Cl. .............................................. 219/400; 374/57
[58] Field of Search .................................... 219/400, 393; 392/347, 370–374; 34/196, 197, 221, 231–233, 202, 553; 374/45, 57; 126/21 A; 165/104.31; 324/158.1

[56] References Cited

U.S. PATENT DOCUMENTS

| | | | |
|---|---|---|---|
| 2,456,881 | 12/1948 | Leather | 219/400 |
| 2,862,095 | 11/1958 | Scofield | 219/400 |
| 3,160,153 | 12/1964 | Drayer | 219/400 |
| 3,505,989 | 4/1970 | Truhan | 219/400 |
| 3,577,650 | 5/1971 | Brahm | 34/233 |
| 4,039,278 | 8/1977 | Denholm | 126/21 A |
| 4,100,682 | 7/1978 | Corrigan | 34/196 |
| 4,787,752 | 11/1988 | Fraser et al. | 374/45 |
| 4,854,726 | 8/1989 | Lesley et al. | 374/45 |
| 4,967,155 | 10/1990 | Magnuson | 324/158 |
| 5,486,681 | 1/1996 | Dagnac et al. | 219/400 |
| 5,859,409 | 1/1999 | Kim et al. | 219/400 |

FOREIGN PATENT DOCUMENTS

| | | |
|---|---|---|
| 58-6334 | 1/1983 | Japan . |

OTHER PUBLICATIONS

IBM Tech. Disclosure Bulletin, vol. 26, No. 3A, Aug. 1983, p. 1266.
IBM Tech. Disclosure Bulletin, vol. 8, No. 12, May 1966, p. 1858.
IBM Tech. Disclosure Bulletin, vol. 20, No. 5, Oct. 1977, p. 1837.

*Primary Examiner*—Joseph Pelham
*Attorney, Agent, or Firm*—Gary Cary Ware & Freidenrich LLP

[57] ABSTRACT

A portable heating tent (10) and method are disclosed for testing telecommunications equipment (16). The portable heating tent (100 includes a tent assembly (12) that provides a housing sized to contain telecommunications equipment (16) for testing. The housing has an inlet to receive return air and has an outlet to provide supply air. The portable heating tent (10) also includes a heater/blower assembly (14) that has an inlet (20) coupled to the outlet of the housing and an outlet coupled to the inlet of the housing. The heater/blower assembly (14) processes the supply air and provides the return air such that a temperature within the housing is established at a desired set point for heat testing the telecommunications equipment (16).

29 Claims, 6 Drawing Sheets

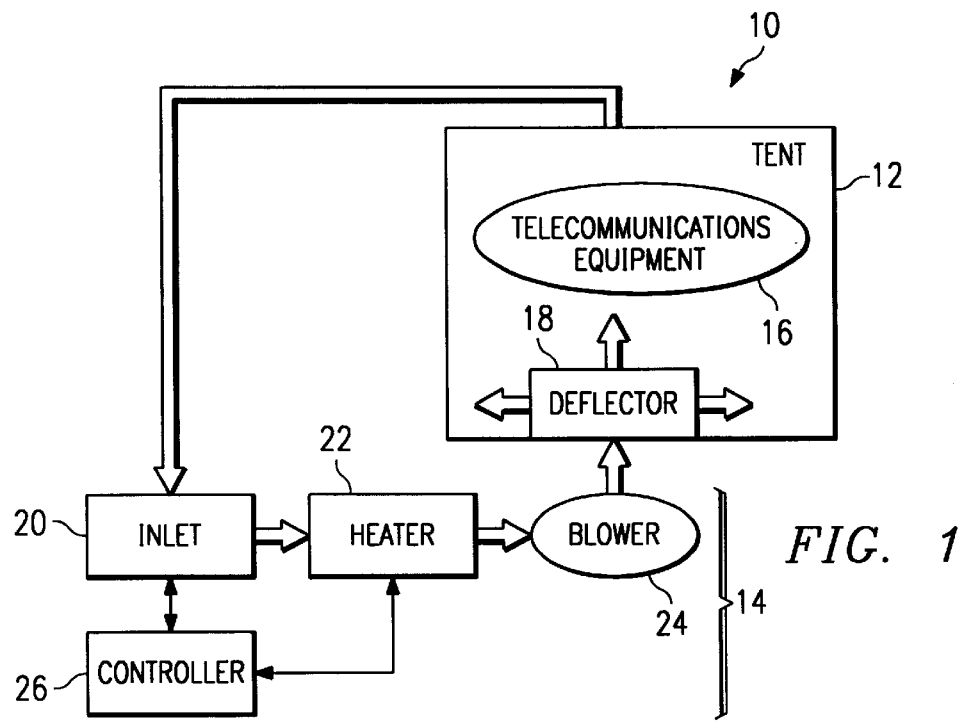
*FIG. 1*
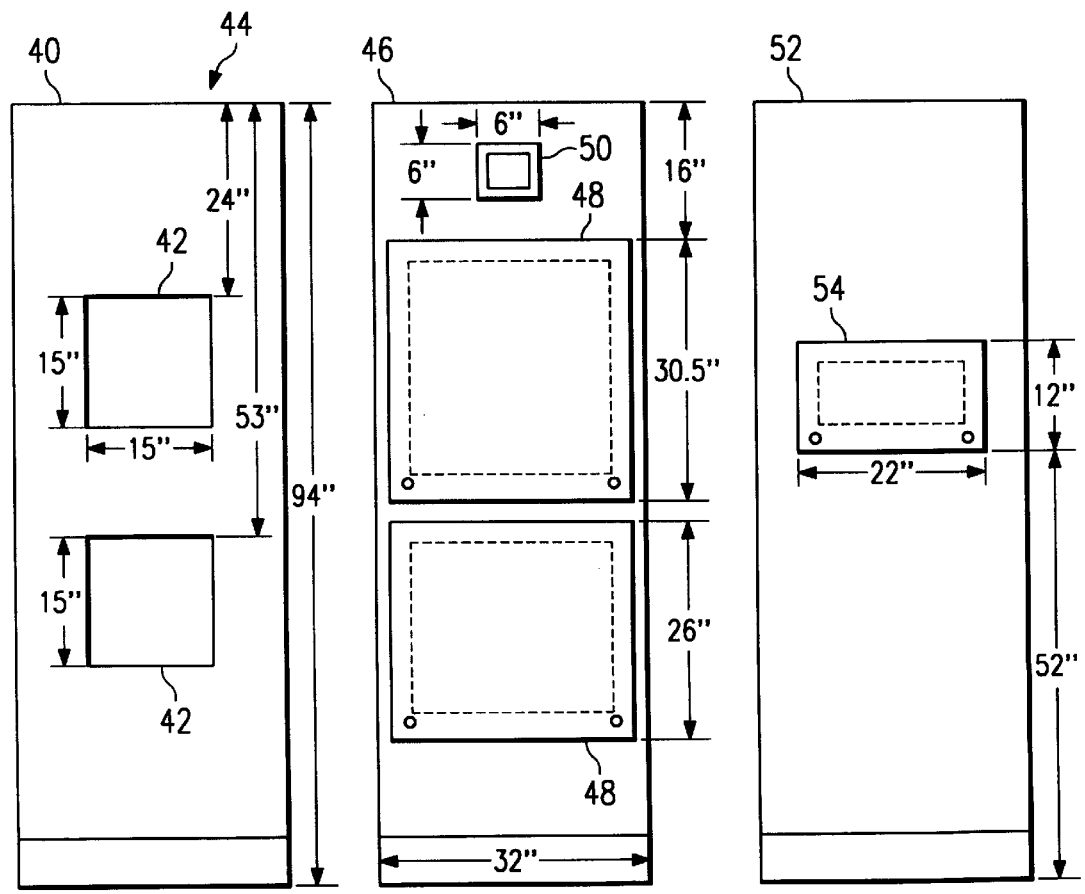
*FIG. 3A*  *FIG. 3B*  *FIG. 3C*

PORTABLE HEATING TENT AND METHOD FOR TESTING TELECOMMUNICATIONS EQUIPMENT

TECHNICAL FIELD OF THE INVENTION

This invention relates in general to the field of telecommunications equipment testing, and more particularly to a portable heating tent and method for testing telecommunications equipment.

BACKGROUND OF THE INVENTION

Testing in the manufacturing environment changed significantly in recent years. Previously, research and development groups would take appropriate steps to provide a proven product to the manufacturing facility for production. However, due to time-to-market constraints, this is no longer acceptable. One key to producing successful products is now being the earliest to market. As a result, research and development departments have been forced to deliver products faster to the manufacturing facility, which in turn introduces risk to quality.

To accommodate this situation, manufacturing facilities have set up different schemes for qualifying new products to ensure high quality. In general, more work is done up-front with the research and development group to ensure enough margin for manufacturing processes as well as the testing philosophy. Further, products are often taken after functionality testing processes have been done and run through a test environment similar to that in which they will be used by customers. This is done to ensure that customers receive a quality product and do not become the evaluation area for the product.

In order to accomplish customer environment testing, changes have been made to ensure that the manufacturing facility is flexible and can handle different issues that may arise. The customer setup is used and tested to ensure that major issues are seen before they are discovered by customers. One important part of this customer environment testing is to qualify new products at temperature extremes. For this reason, telecommunications equipment is often tested at both cold and hot extreme temperatures.

In the past, temperature testing has been accomplished by building a custom chamber for holding the telecommunications equipment. In this scheme, the testing equipment is built as a custom test chamber around each set of equipment which is temperature tested. Generally, such chambers are costly (e.g., in the range of $200,000) to build and install. Once completed, these chambers allow testing at both cold and hot temperature extremes in a process that generally takes 48 hours to complete.

SUMMARY OF THE INVENTION

In accordance with the present invention, a portable heating tent and method for testing telecommunications equipment are disclosed that provide substantial advantages over conventional testing equipment and methods.

According to one aspect of the present invention, a portable heating tent is disclosed for testing telecommunications equipment. The portable heating tent includes a tent assembly that provides a housing sized to contain telecommunications equipment for testing. The housing has an inlet to receive return air and has an outlet to provide supply air. The portable heating tent also includes a heater/blower assembly that has an inlet coupled to the outlet of the housing and an outlet coupled to the inlet of the housing. The heater/blower assembly processes the supply air and provides the return air such that a temperature within the housing is established at a desired set point for heat testing the telecommunications equipment.

According to another aspect of the present invention, a method is disclosed for testing telecommunications equipment. The telecommunications equipment is positioned in a housing, formed by a portable heating tent, that has an outlet to provide supply air and an inlet to receive return air. Supply air is received from the outlet of the housing and processed. The return air is then provided through the inlet of the housing such that a temperature within the housing is established at a desired set point for heat testing the telecommunications equipment.

A technical advantage of the present invention is that the portable heating tent is significantly less expensive and much easier to construct than prior testing environments.

Another technical advantage of the present invention is the use of the portable heating tent to accomplish testing at hot temperature extremes in a process that requires much less time to test a particular set of telecommunications equipment (e.g., 18 hours as opposed to 48 hours).

A further technical advantage of the present invention is the flexibility it provides to the manufacturing facility. If the volume of products that need to be tested increases, additional portable heating tents can be constructed and brought on-line within a relatively short time period. For example, a portable heating tent of the present invention may take two weeks to build as opposed to 10 to 16 weeks required for conventional temperature testing chambers. Further, the present portable heating tent allows multiple racks of telecommunications equipment to be connected together to increase testing capacity if needed. The racks can be located in separate heating tents with portholes for cabling to connect the equipment together.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein:

FIG. 1 is a block diagram of one embodiment of a portable heating tent constructed according to the present invention;

FIGS. 3A, 3B and 3C are diagrams of one embodiment of front, back and side panels for a tent assembly of the portable heating tent according to the present invention;

DETAILED DESCRIPTION OF THE INVENTION

Figure 2:
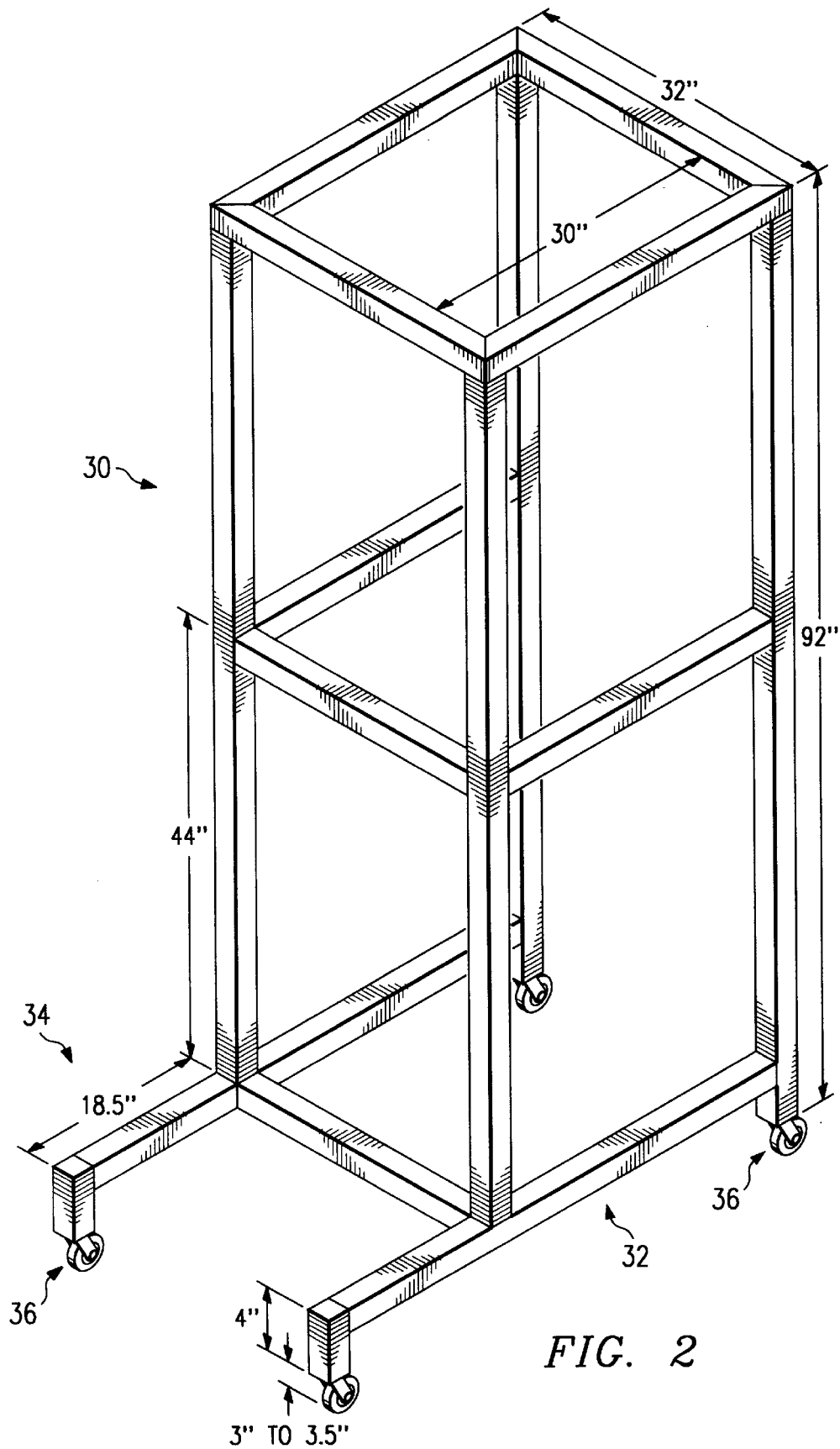
FIG. 2 is a diagram of one embodiment of a tent frame according to the present invention.

The portable heating tent and testing method of the present invention provide an economical and efficient means for hot temperature testing of telecommunications equipment. According to the present invention, after a six month sample was conducted of more than 2,000 unit failure symptoms, it was discovered that approximately 95% of the failures occurred at ambient or hot temperatures. Conventional temperature chambers used for testing perform temperature testing at both cold extremes and hot extremes. In light of the discovery that the ambient and hot temperatures produce most of the return in terms of failure detection, it was determined that testing chamber cooling was a function that would not need to be used often. It was further recognized that, with the necessity to increase capacity for testing, resources would need to be allocated either to building conventional temperature chambers or to finding an alternative.

FIG. 1 is a block diagram of one embodiment of a portable heating tent, indicated generally at 10, constructed according to the present invention. Portable heating tent comprises a tent assembly 12 and a heater/blower assembly 14, as shown. Tent assembly 12 houses telecommunications equipment 16 to be tested. Telecommunications equipment 16 is typically housed by a rack which fits inside tent assembly 12. Tent assembly 12 includes deflectors 18 for deflecting incoming return air flow from heater/blower assembly 14 in both lateral and upward directions. In one embodiment of the present invention, deflectors 18 direct approximately 80% of the air flow upward and 20% of the air flow laterally. This allows tent assembly 12 to achieve a consistent temperature set point throughout the environment within tent assembly 12. This consistent temperature is advantageous in that telecommunications equipment 16 does not experience hot spots during testing.

In the embodiment of FIG. 1, heater/blower assembly 14 comprises an inlet 20 which receives supply air pulled from tent assembly 12, and preferably pulled from the top of tent assembly 12. Inlet 20 feeds the air flow to a heater 22 which in turn feeds a blower 24. A controller 26 is coupled to inlet 20 and to heater 22 for measuring temperature and controlling operation of heater 22. In the illustrated embodiment, controller 26 measures the temperature of the supply air at inlet 20 and compares that temperature against the desired set point. Based upon that comparison, controller 26 operates heater 22 to heat the air, if necessary. In this embodiment, blower 24 is always on and directs return air towards deflectors 18 in tent assembly 12. This maintains air flow within tent assembly 12 and prevents formation of hot spots. As shown, the return air from blower 24 is directed to deflectors 18 and thus directed laterally and upwardly within tent assembly 12.

The portable heating tent of the present invention provides an advantageous alternative to conventional temperature chambers by providing hot temperature testing in an inexpensive and easy to build apparatus with a significantly reduced test time. In one embodiment, each portable heating tent costs on the average of $1,400 and takes about two weeks to build and have operational. With a conventional temperature chamber, on the other hand, it typically would take 10 weeks or more to get operational and would cost in the range of $200,000. Further, a manufacturing facility generally does not have flexibility with conventional temperature chambers because they are constructed for a particular set of equipment. The portable heating tents of the present invention provide flexibility in that they can hold any set of telecommunications equipments installed on a standard rack. In addition, the testing time is reduced significantly to a shorter cycle time according to the present invention. By omitting the cold soak time and transition time needed in conventional testing chambers, the present invention can reduce testing time, for example, from approximately 48 hours to 18 hours. This translates to significant increases in throughput for the manufacturing facility.

In one implementation, the portable heating tent of the present invention was based generally upon several principles. First, the size of the heating tent was based on the fact that most telecommunications equipment is racked inside a frame which is 7 feet tall and 26 inches or smaller in width. Some taller rack frames are built, but the percentage is small enough that the portable heating tent was established at 8 feet. Second, a heating source and controller is used to ensure a rapid increase of temperature to a desired set point and also to provide the ability to reach the testing temperature in cases where the telecommunications equipment does not produce much heat, itself. Third, the portable heating tent is movable so that it can be moved from station to station, if necessary. The tent design also makes it easy to change portholes or flaps to gain access to the equipment inside of the heating tent.

The portable heating tent of the present invention avoids a number of problems with conventional testing methods. For example, the previous methods made the tester build an individual chamber around each new product under test which is time consuming and costly. Also, the previous methods often relied on the equipment under test to supply enough heat to reach the temperature test point. However, modern equipment often does not produce enough heat to reach such temperatures. Also, the time for reaching the testing temperature is not consistent.

The portable heating tent and testing method of the present invention provide significant advantages to the manufacturing facility. The portable heating tent is reusable and does not have to be discarded after a certain piece of equipment is tested. The portable heating tent also provides a stable temperature point for testing the equipment. The portable heating tent is significantly less expensive and time consuming to build and set-up and provides a significantly reduced test cycle time. With respect to a conventional 48-hour burn in time with three cycles per day, the testing time can be reduced from 48 hours to 18 hours by removing the cold soak and the transition time to cold temperatures. With the present invention it is also possible to reduce this time even further with time to failure monitoring. A further advantage of the present invention is the flexibility given to the manufacturing group. Testing volume can be increased relatively easily by building new heating tents.

FIG. 2 is a diagram of one embodiment of a tent frame, indicated generally at 30, for tent assembly 12 according to the present invention. In this embodiment, the tent frame 30 comprises interconnected structural members formed preferably from one inch-square metal tubing (14 gauge). Tent frame 30 forms a housing area 32 for housing the telecommunications equipment to be tested. Tent frame 30 also forms a support area 34 for holding heater/blower assembly 14. Tent frame 30 of FIG. 2 further includes a plurality of casters 36 upon which tent frame 30 can be rolled. Further, tent frame 30 of FIG. 2 has the dimensions, as shown, such that housing area 32 can house a standard 7 foot tall and 26 inch wide rack. Other dimensions for tent frame 30 are possible, but the dimensions shown have been proven to be useful for standard customer installations of telecommunications equipment.

FIGS. 3A, 3B and 3C are diagrams of one embodiment of front, back and side panels that are attached to tent frame 30 to form the housing for the equipment under test. In this embodiment, the panels are constructed from thermally reflecting insulating material, and in particular are constructed from REFLECTIX aluminized insulation. The thermally reflecting insulating material used to construct the front, back and side panels allows the temperature within the tent assembly to more easily reach and be maintained at the desired set point.

FIG. 3A illustrates a front panel 40 which includes a pair of windows 42 that are constructed from clear plastic and allow visual inspection of the telecommunications equipment inside of the tent assembly. Front panel 40 further includes snaps along sides 44 so that the front panel can be removably affixed to the side panels. Front panel 40 can then be opened and closed as necessary to gain access to the inside of the tent assembly. The dimensions shown in FIGS. 3A, 3B and 3C are appropriate for tent frame of FIG. 2 and have been proven to be effective for use in testing telecommunications equipment.

FIG. 3B illustrates a back panel 46 for the tent assembly. Back panel 46 includes two ports 48 and a flap 50 for providing access to the back of the telecommunications equipment under test. Ports 48 are generally secured during testing but can be opened as necessary to gain access the telecommunications equipment for setting up the equipment. Flap 50 is used for running cables outside of the tent assembly to equipment in other heating tents or for other needed connections.

FIG. 3C illustrates side panels 52. Each side panel 52 includes a flap 54 for providing access to the side of the telecommunications equipment. Side panels 52 include snaps for connecting to snaps on sides 44 of front panel 40. The front panel 40, back panel 46 and side panels 52 are attached to the tent frame to form the housing for the telecommunications equipment.

Figure 4A:
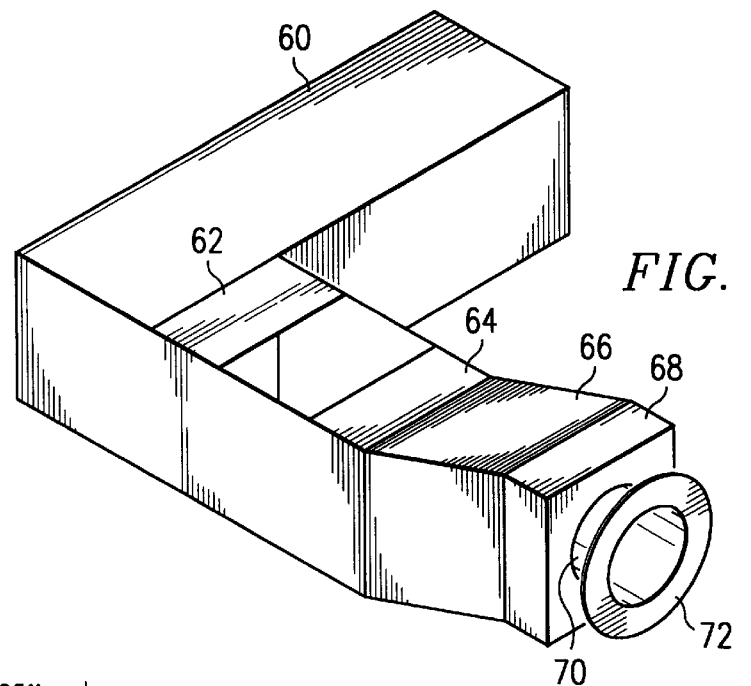
FIGS. 4A, 4B and 4C are diagrams of one embodiment of a housing for a heater/blower assembly of the portable heating tent according to the present invention.
Figure 4B:
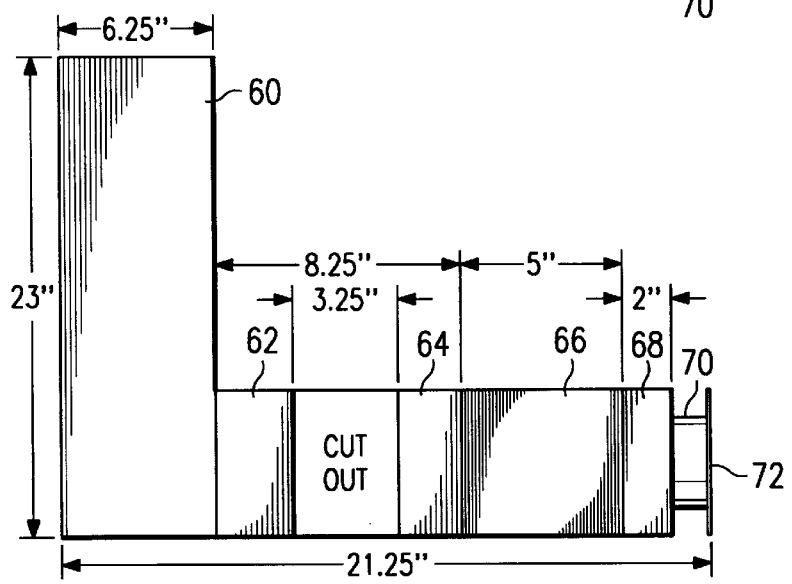
Figure 4C:
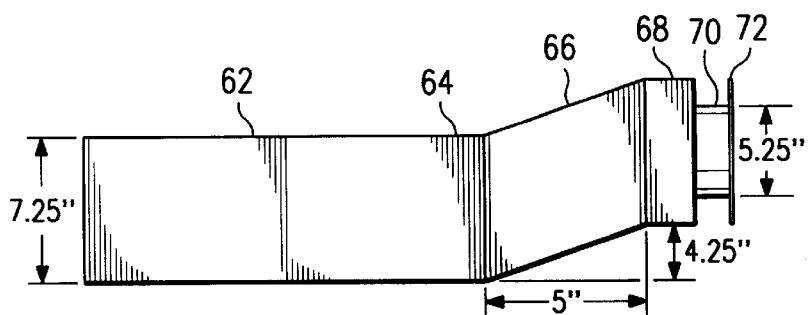

FIGS. 4A, 4B and 4C are diagrams of one embodiment of a housing for the heater/blower assembly according to the present invention. As shown in FIG. 4A, the housing can include a number of metal sections 60, 62, 64, 68 and 70. These sections provide space for housing the inlet blower, heater and controller of the heater/blower assembly. Further, the housing for the heater/blower assembly includes an adapter 72 for providing air flow to the tent assembly 12. FIGS. 4B and 4C provide representative dimensions for the various pieces of the housing for the heater/blower assembly. Further, FIG. 4B shows where a cutout can be made to hold the heater. The housing for the heater assembly 14 is generally constructed from metal pieces coupled together to form a structure that can be supported by the support area of the tent frame.

Figure 5A:
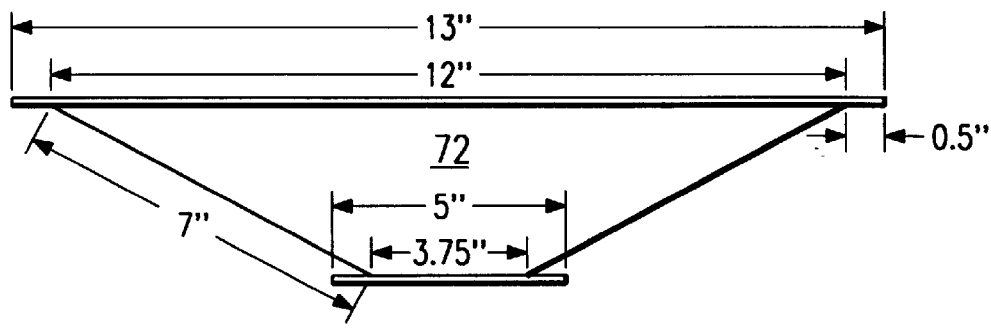
FIGS. 5A, 5B and 5C are diagrams of one embodiment of a boot that interfaces between the heater blower assembly and the tent assembly according to the present invention.
Figure 5B:
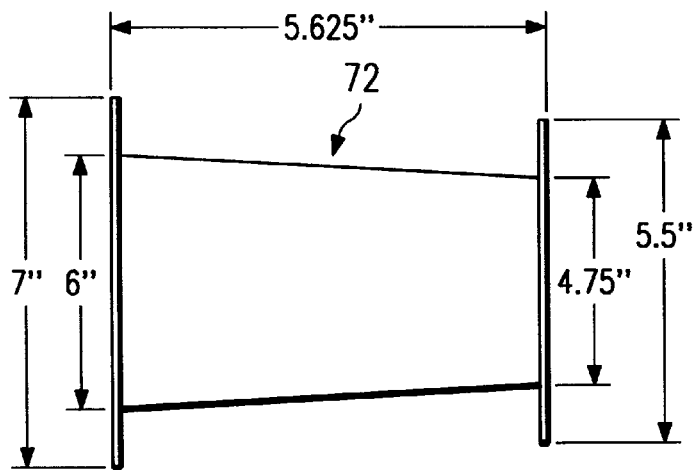
Figure 5C:
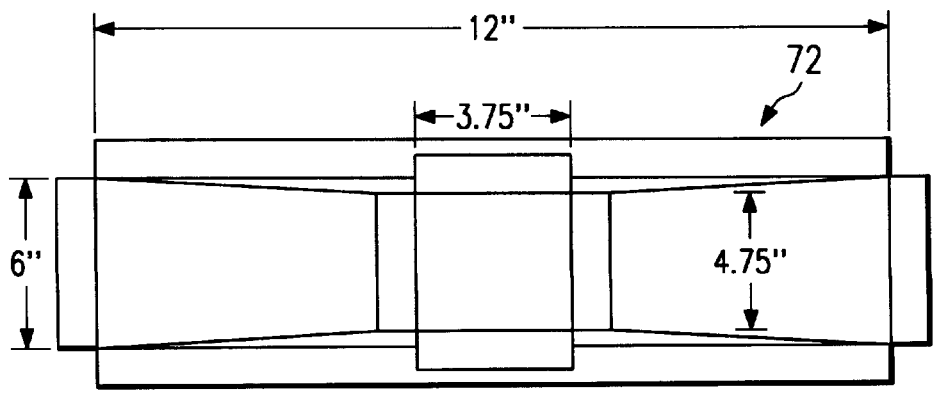

FIGS. 5A, 5B and 5C are diagrams of one embodiment of a boot 72 used to interface between the heater/blower assembly and the heating tent assembly. Boot 72 generally has a trapezoidal structure and adapts from a smaller outlet of the heater/blower assembly to a larger inlet of the tent assembly. FIGS. 5A, 5B and 5C show representative dimensions for boot 72 in accordance with the size of the other components described. Boot 72 supplies return air to deflectors within the tent assembly, and the deflectors then direct air towards the top and towards the side of the tent, as described above. This air flow allows the telecommunications equipment to be heated to a desired set point and maintained at that set point with consistent heat distribution throughout the tent assembly.

Figure 6A:
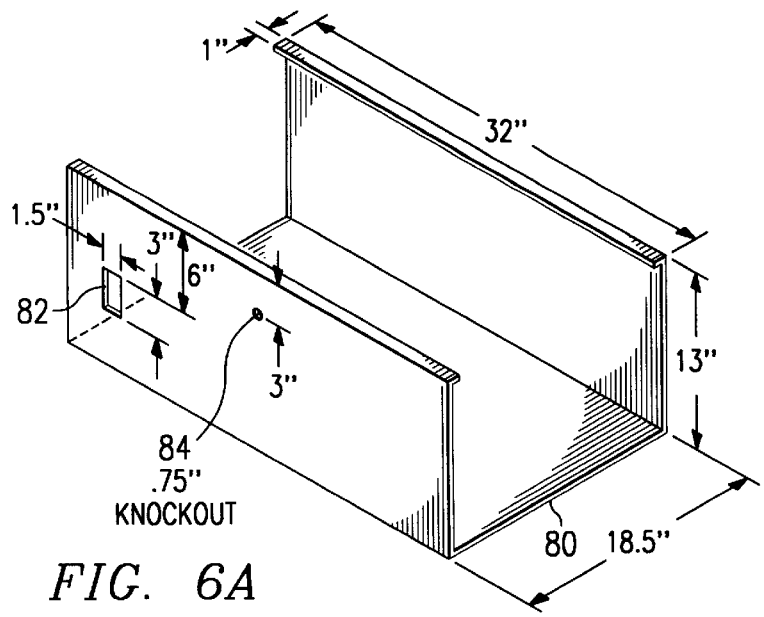
FIGS. 6A, 6B, 6C and 6D are diagrams of one embodiment of a housing for a temperature regulating subsystem according to the present invention.
Figure 6B:
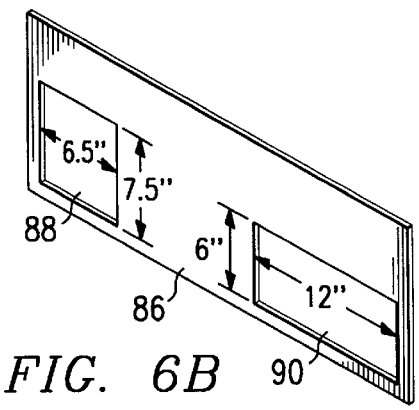
Figure 6C:
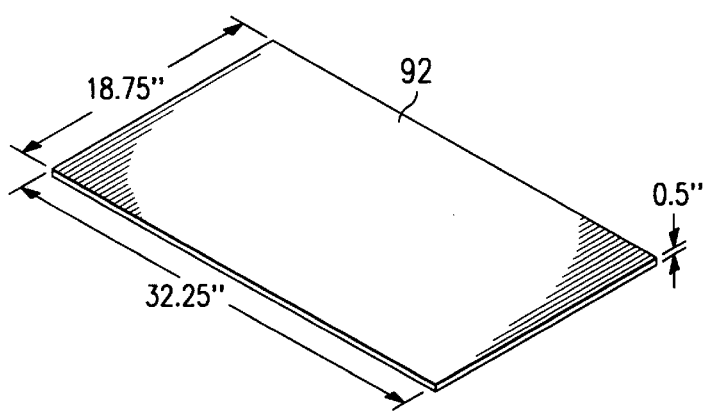
Figure 6D:
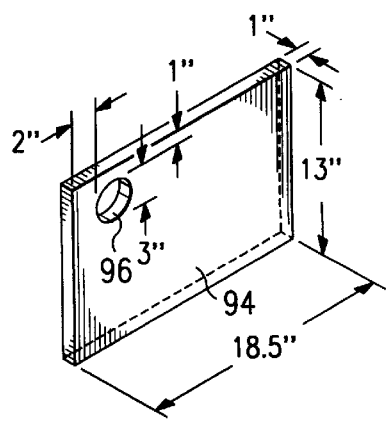

FIGS. 6A, 6B, 6C and 6D are diagrams of one embodiment of a housing for holding a temperature regulating subsystem according to the present invention. As shown in FIG. 6A, the housing includes a partial box component having a rectangular knock-out 82 and a circular knock-out 84 cut in one side. The representative dimensions provided for this component 80, as well as the other illustrated components, are in relation to the dimensions of other portions that have been described. FIG. 6B shows a back panel 86 for the housing. Back panel 86 includes two openings 88 and 90. FIG. 6C shows a perforated metal top for the housing. Perforated metal top 92 allows heat to dissipate into the outside atmosphere to prevent the heater/blower assembly from becoming overheated. Finally, FIG. 6D shows the left panel 94 which includes an inlet port 96 for receiving air flow from the heating tent. In this embodiment, the housing can be constructed from a minimum 16 gauge metal material.

Figure 7:
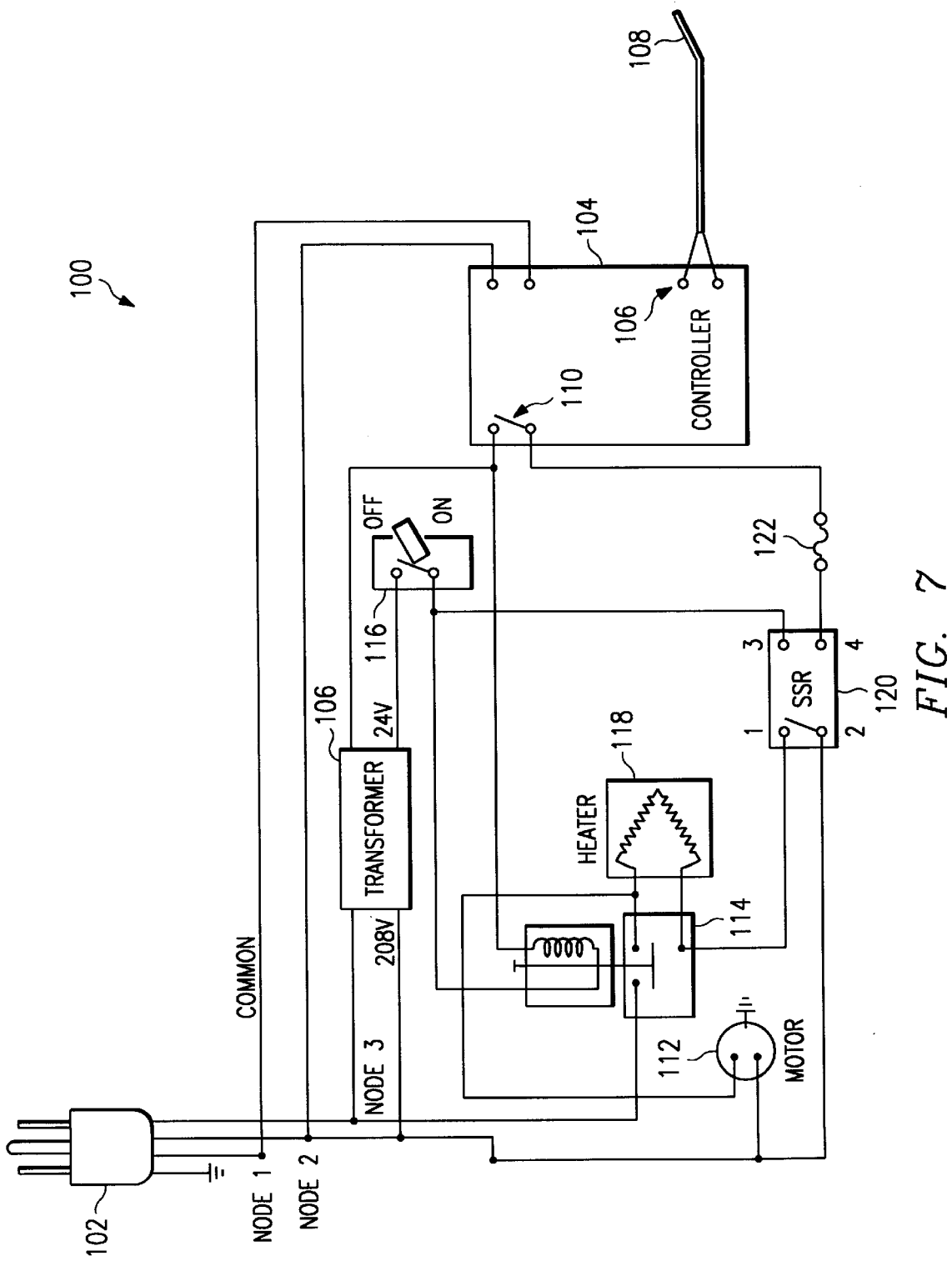
FIG. 7 is a circuit diagram of one embodiment of the temperature regulating subsystem electronics for the heater/blower assembly of the portable heating tent according to the present invention.

FIG. 7 is a circuit diagram of one embodiment of the temperature regulating subsystem, indicated generally at 100, according to the present invention. The temperature regulating subsystem 100, includes a twist lock plug 102. In particular, twist lock plug 102 can be a 208-volt single phase 60-Hertz twist lock plug rated at 30 amps. Twist lock plug 102 can be grounded to the framework of the unit, as shown. Twist lock plug 102 provides three terminals which include a common terminal and two hot terminals. The common terminal is connected to NODE 1, the first hot terminal is connected to NODE 2, and the third hot terminal is connected to NODE 3. As shown, NODE 1 is, in turn, connected to a controller 104.

Controller 104 controls the power to the heater to regulate temperature inside the portable heating tent. Controller 104 receives supply power of 120 volts and 60 Hertz. Controller 104 has a temperature sensor input 106 which is coupled to a thermocouple 108. In the illustrated embodiment, thermocouple 108 is a type "T" thermocouple. Controller 104 also includes a heat relay 110 for applying power to the heater. NODE 2 from twist lock plug 102 is connected to controller 104, transformer 106 and a circulator (blower) motor 112, as shown. NODE 3 is connected to transformer 106 and to a system enable contactor 114. Transformer 106 converts the 208-volt incoming signal to a 24-volt signal and provides the output to heat relay 110 of controller 104 as well as to a switch 116. Switch 116 can comprise a typical 15 amp residential light switch or other appropriate switch. Temperature regulating system 100 further includes a heater 118 and a solid state relay 120. Heater 118 is connected to system enable contactor 114 as well as to circulator motor 112. Solid state relay 120 is connected to system enable contactor 114, to switch 116 and to an over temperature safety device 122. In particular, over temperature safety device 122 can be a KLIXON safety device rated at 160 degrees Fahrenheit. The solid state relay 120 operates by closing the connection between terminals 1 and 2 when there is 24 volts AC across terminals 3 and 4.

In operation, temperature regulating system 100 operates to measure the temperature of the air return from the top of the heating tent. Then, in response to a need to heat the air, controller 104 closes heat relay 110 which engages the heater 118 and heats the air as it travels from the inlet to the blower. In this embodiment of the present invention, the circulation motor 112 (blower) is always on and is not controlled by the controller. In this embodiment, the control essentially is whether or not the air is heated as it passes through the heater/blower assembly. Alternative embodiments can include control of additional functions.

The portable heating tent shown in and described with respect to the FIGUREs provides significant advantages in the manufacturing environment for testing telecommunications equipment. In particular, the portable heating tent allows telecommunications equipment to be tested at high temperature set points where the testing temperature is consistent throughout the heating tent and is achieved relatively quickly. Further, this process allows testing time to be significantly reduced. In one test environment, the testing time for a set of telecommunications equipment was reduced from 48 hours to 18 hours. This reduction generated a 2.7 times increase in throughput which translates directly to a more efficient and profitable manufacturing environment.

Although the present invention has been described in detail, it should be understood that various changes, substitutions and alterations can be made hereto without departing from the spirit and scope of the invention as defined by the appended claims.

What claimed is:

1. A portable heating tent for testing telecommunications equipment, comprising:
   a tent assembly providing a housing sized to contain telecommunications equipment for testing, the housing having an inlet to receive return air and having an outlet to provide supply air, the assembly further comprising deflectors, the deflectors causing the return air to be directed laterally and upward within the housing; and
   a heater/blower assembly having an inlet coupled to the outlet of the housing and having an outlet coupled to the inlet of the housing, the heater/blower assembly processing the supply air and providing the return air such that a temperature within the housing is established at a desired set point for heat testing the telecommunications equipment.

2. The portable heating tent of claim 1, wherein the heater/blower assembly comprises:
   a heater coupled to receive supply air from the inlet of the heater/blower;
   a blower coupled to receive air from the heater and to provide the return air to the outlet of the heater/blower assembly; and
   a controller operable to measure a temperature of the supply air and to control the heater to maintain a temperature of the return air at a desired set point.

3. The portable heating tent of claim 1, wherein the tent assembly further comprises deflectors positioned proximate the inlet.

4. The portable heating tent of claim 3, wherein the deflectors cause approximately twenty percent of the return air to be directed laterally and approximately eighty percent of the return air to be directed upward.

5. The portable heating tent of claim 1, wherein the tent assembly comprises:
   a tent frame; and
   front, back and side panels coupled to the tent frame to form the housing.

6. The portable heating tent of claim 5, wherein the tent frame is constructed from square metal tubing.

7. The portable heating tent of claim 6, wherein the tent frame comprises casters to allow the tent frame to be moved.

8. The portable heating tent of claim 5, wherein the panels are constructed from thermally reflecting insulating material.

9. The portable heating tent of claim 8, wherein the thermally reflecting insulating material is aluminized insulation.

10. The portable heating tent of claim 5, wherein the front panel has a window formed therein using a clear plastic material.

11. The portable heating tent of claim 5, wherein the side panels have ports formed therein that can be opened and closed to gain access to an interior of the tent assembly.

12. The portable heating tent of claim 5, wherein the back panel has a port formed therein that can be opened and closed to gain access to an interior of the tent assembly.

13. The portable heating tent of claim 5, wherein the back panel has a flap formed therein that can be used to run cables from an interior of the tent assembly.

14. A portable heating tent for testing telecommunications equipment, comprising:
   a tent assembly providing a housing sized to contain telecommunications equipment for testing, the housing having an inlet to receive return air and having an outlet to provide supply air, the tent, assembly comprising:
   a tent frame constructed from square metal tubing and having casters to allow the frame to be moved; and
   front, back and side panels coupled to the tent frame to form the housing, the panels constructed from thermally reflecting insulating material; and
   deflectors positioned proximate the inlet, the deflectors causing the return air to be directed laterally and upward within the housing; and
   a heater/blower assembly having an inlet coupled to the outlet of the housing and having an outlet coupled to the inlet of the housing, the heater/blower assembly comprising:
   a heater coupled to receive air from the inlet of the heater/blower;
   a blower coupled to receive air from the heater and to provide the return air to the outlet of the heater/blower assembly; and
   a controller operable to measure a temperature of the supply air and to control the heater to maintain a temperature of the supply air at a desired set point,
   the heater/blower assembly processing the supply air and providing the return air such that a temperature within the housing is established at a desired set point for heat testing the telecommunications equipment.

15. The portable heating tent of claim 14, wherein the tent frame is constructed from square metal tubing.

16. The portable heating tent of claim 15, wherein the tent frame further comprises casters to allow the tent frame to be moved.

17. The portable heating tent of claim 14, wherein the thermally reflecting insulating material is aluminized insulation.

18. A method for testing telecommunications equipment, comprising:
   positioning telecommunications equipment in a housing that has an outlet to provide supply air and an inlet to receive return air, the housing formed by a portable heating tent;
   receiving supply air from the outlet in the housing;
   processing the supply air;
   providing the return air through the inlet in the housing; and
   directing the return air laterally and upwards within the housing such that a temperature within the housing is established at a desired set point for heat testing the telecommunications equipment.

19. The method of claim 18, wherein receiving, processing and providing are accomplished by a heater/blower assembly.

20. The method of claim 19, wherein the heater/blower assembly comprises:
- a heater coupled to receive supply air from the inlet of the heater/blower;
- a blower coupled to receive air from the heater and to provide the return air to the outlet of the heater/blower assembly; and
- a controller operable to measure a temperature of the supply air and to control the heater to maintain a temperature of the supply air at a desired set point.

21. The method of claim 18, wherein directing is accomplished by deflecting the supply air in the housing.

22. The method of claim 21, wherein approximately twenty percent of the supply air is directed laterally and approximately eighty percent of the supply air is directed upward.

23. The method of claim 18 wherein positioning comprises:
- providing a tent assembly that comprises:
  - a tent frame; and
  - front, back and side panels coupled to the tent frame to form the housing, and
- positioning the telecommunications equipment in the housing.

24. The method of claim 23, wherein the tent frame is constructed from square metal tubing.

25. The method of claim 24, wherein the tent frame comprises casters to allow the tent frame to be moved.

26. The method of claim 23, wherein the panels are constructed from thermally reflecting insulating material.

27. The method of claim 26, wherein the thermally reflecting insulating material is aluminized insulation.

28. A lightweight portable heating tent for testing telecommunications equipment, consisting of:
- a tent assembly providing a housing sized to contain telecommunications equipment for testing, the housing having an inlet to receive return air and having an outlet to provide supply air;
- a heater/blower assembly consisting of:
  - a single path of air flow;
  - a heater with on/off control;
  - a constant air flow rate through the heater; and
- the heater/blower assembly having an inlet coupled to the outlet of the housing and having an outlet coupled to the inlet of the housing, the heater/blower assembly processing the supply air such that a uniform temperature within the housing is established at a desired set point above ambient temperature for heat testing the telecommunications equipment, and wherein the tent assembly further comprises deflectors positioned proximate the inlet, the deflectors causing the return air to be directed laterally and upward within the housing.

29. The portable heating tent of claim 28, wherein the deflectors cause approximately twenty percent of the return air to be directed laterally and approximately eighty percent of the return air to be directed upward.

* * * * *